United States Patent [19]

Tsunooka et al.

[11] Patent Number: 4,638,206
[45] Date of Patent: Jan. 20, 1987

[54] SHEET-LIKE PIEZOELECTRIC ELEMENT

[75] Inventors: Tsutomu Tsunooka, Kariya; Tadashi Takeuchi, Nagoya; Kunihiro Ushida, Aichi; Shogo Kawajiri, Nagoya, all of Japan

[73] Assignee: NGK Spark Plug Co., Ltd., Nagoya, Japan

[21] Appl. No.: 744,618

[22] Filed: Jun. 14, 1985

[30] Foreign Application Priority Data

Jun. 14, 1984 [JP] Japan .................. 59-122435

[51] Int. Cl.⁴ .................................... H01L 41/08
[52] U.S. Cl. .................. 310/313 B; 310/325; 310/359; 310/365
[58] Field of Search ............... 310/321, 325, 365, 366, 310/358, 359, 313 B

[56] References Cited

U.S. PATENT DOCUMENTS

| | | | |
|---|---|---|---|
| 2,540,194 | 2/1951 | Ellett | 310/366 X |
| 2,540,412 | 2/1951 | Adler | 310/359 X |
| 2,836,737 | 5/1958 | Crownover | 310/365 X |
| 3,114,849 | 12/1963 | Poschenrieder | 310/365 X |
| 3,175,107 | 3/1965 | Brussaard et al. | 310/359 |
| 3,365,592 | 1/1968 | Krautwald et al. | 310/359 X |
| 4,350,916 | 9/1982 | August et al. | 310/313 B |
| 4,407,054 | 10/1983 | Zipfel, Jr. | 310/358 X |

Primary Examiner—Patrick R. Salce
Assistant Examiner—Emanuel Todd Voeltz
Attorney, Agent, or Firm—Larson and Taylor

[57] ABSTRACT

Sheet-like piezoelectric element in which a plurality of slits are formed between the comb-shaped electrodes alternately projected in a zigzag shape from a pair of terminals arranged oppositely, a piezoelectric layer of composite piezoelectric material is filled into the slits, a DC voltage is applied between the terminals to polarize the adjacent layers in reverse directions to each other, and the electrodes have a thickness corresponding to that of the piezoelectric layer. The element may be used for an electro-mechanical transducer or a thermal-electric transducer.

7 Claims, 7 Drawing Figures

SHEET-LIKE PIEZOELECTRIC ELEMENT

FIELD OF THE INVENTION

The present invention relates to a sheet-like piezoelectric element and more particularly, but not exclusively, to such an element which can be used for an electro-mechanical transducer and a thermal-electric transducer.

BACKGROUND OF THE INVENTION

In the electro-mechanical transducer such as a speaker, a headphone, a microphone, or a hydrophone, a piezoelectric material has been utilized as a vibration film in view of the moldability, workability and mechanical properties thereof. For example, Japanese Patent Kokai No. 3734/73 discloses an electro-acoustic transducer in which a natural or synthetic polymer piezoelectric material is used as a vibrator element. The transducer comprises two thin film-like members made of polymer piezoelectric material and having entirely or partly piezoelectricity, at least two opposite ends of the members in longitudinal direction being fixed to support members having high rigidity. Between the piezoelectric members an auxiliary member is inserted for giving a deflecting stress to each piezoelectric member, and electrodes are provided on both side surfaces of the piezoelectric members. In Japanese Patent Kokai No. 56128/73 there has been proposed a piezoelectric speaker which includes a plate of the material having at least partly piezoelectric properties, an AC electric field being applied to the plate in the thickness direction and being converted into a mechanical vibration by the piezoelectric properties of the material, and the entire unit being operated as a sound radiator by the mechanical vibration.

Further, U.S. Pat. No. 4,088,915 discloses a piezoelectric electric-acoustic transducer using a diaphragm made of a piezoelectric film in which the diaphragm is supported by a support member having a curved portion to impact a suitable resiliency and/or tension to the diaphragm, thereby improving acoustic characteristics without reducing efficiency in the vibration of the diaphragm.

In general, it is known that when a large $k_{33}(g_{33}, d_{33})$ mode of an electro-mechanical conversion rate is utilized in a sheet-like piezoelectric element, the piezoelectric element is polarized in its lengthwise direction. In order to facilitate the polarization, a specific electrode arrangement may be used as will be described hereinafter.

In the prior art as mentioned above, since polarized voltages are applied to the surface portion of piezoelectric body or substrate, but no voltage is applied to the back portion thereof, irregular polarization occurs in the thickness direction of the piezoelectric substrate, with the result there is a drawback that the converting efficiency may be cause to deteriorate.

On the other hand, it is preferably to make the thickness of the piezoelectric body as thin as possible so as to uniformly apply the polarizing voltage in the thickness direction, but this has the disadvantage of reduced mechanical strength.

According to a recent development, there has been provided a polymer composite piezoelectric material having a piezoelectricity which is considerably higher than that of the conventional polymer piezoelectric material. Such composite piezoelectric material may usually be produced by dispersing piezoelectric ceramic powder having large self-polarization into a basic polymer, and has mechanical properties, moldability and workability which are similar to those of the basic polymer. Thus, the composite piezoelectric material can be easily formed in a film shape, with flexibility different from the conventional piezoelectric material.

It is, therefore, an object of the present invention to provide a sheet-like piezoelectric element which has an increased conversion efficiency and can be easily formed in an arbitrary shape.

Another object of the invention is to provide an electro-mechanical transducer which comprises said sheet-like piezoelectric element.

A further object of the invention is to provide a thermal-electric transducer which comprises said sheet-like piezoelectric element.

SUMMARY OF THE INVENTION

According to one aspect of the present invention, there is provided a sheet-like piezoelectric element comprising a pair of terminals arranged oppositely, comb-shaped electrodes alternately projected from said terminals and in a zigzag shape formed with a slit in the lengthwise direction between the adjacent electrodes, and a piezoelectric layer made of composite piezoelectric material filled in the slits in such a manner that the adjacent piezoelectric layer portions are polarized in opposite directions to each other.

The piezoelectric layer comprises a mixture of piezoelectric ceramic powder and molding agent such as resin, rubber or glass.

It is preferable that the piezoelectric layer has a thickness which is substantially the same as the electrodes to equalize the polarizations.

The adjacent piezoelectric layer portions are polarized reversely to each other by applying a DC voltage to the terminals so that one terminal has a positive polarity and the other terminal has a negative polarity.

According to a second aspect of the present invention, there is provided an electro-mechanical transducer wherein a sheet-like piezoelectric element is bonded to one or both sides of a suitable vibrating plate to form a bimorph structure.

The vibrating plate may be an insulator plate for supporting the piezoelectric element.

BRIEF DESCRIPTION OF THE INVENTION

The invention will be described in detail with reference to the accompanying drawings.

DETAILED DESCRIPTION

Figure 1:
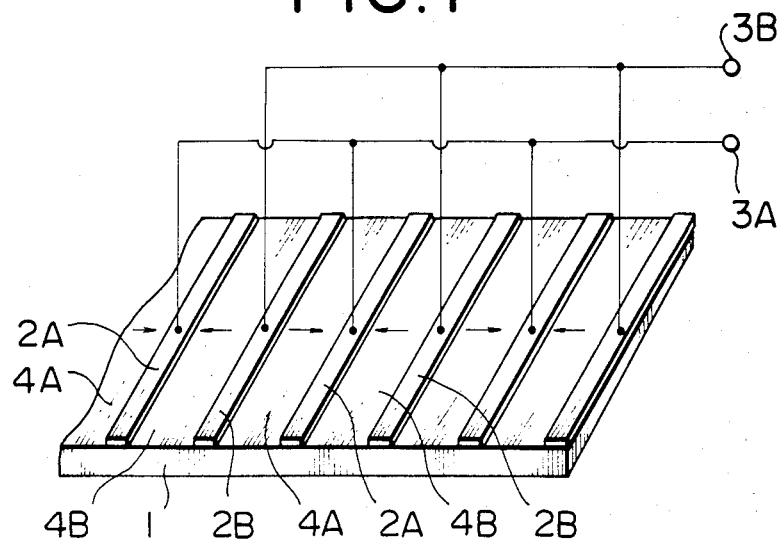
FIG. 1 is a partially fragmental perspective view showing a conventional sheet-like piezoelectric element polarized in the lengthwise direction.
Figure 2:
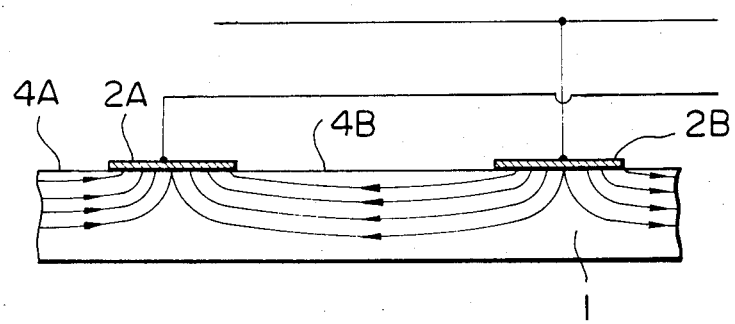
FIG. 2 is an enlarged front view of a portion of the arrangement shown in FIG. 1.

In FIGS. 1 and 2, there is shown a conventional sheet-like piezoelectric element in which a substrate 1 is made of a sintered ceramic such as a lead titan zirconate and the like, on the surface of which a plurality of segment electrodes 2A and 2B are bonded and formed at an equal interval. Each of the electrodes 2A is connected to a positive terminal 3A and each of the other electrodes 2B is connected to a negative terminal 3B. The terminals 3A and 3B are supplied with a predetermined DC voltage. Between the respective segment electrodes 2A and 2B there are defined a plurality of piezoelectric portions 4A and 4B which have different polarizing directions to each other, respectively. In such an arrangement, however, the polarizing voltage is applied to the surface portion of the substrate 1 as shown in FIG. 2, but no voltage is applied to the back surface portion thereof. Therefore, irregular polarization occurs in the thicknesswise direction of the substrate 1. It will be considered that this may be avoided by reducing the thickness of the substrate 1, but it is difficult to maintain sufficient mechanical strength.

Figure 3:
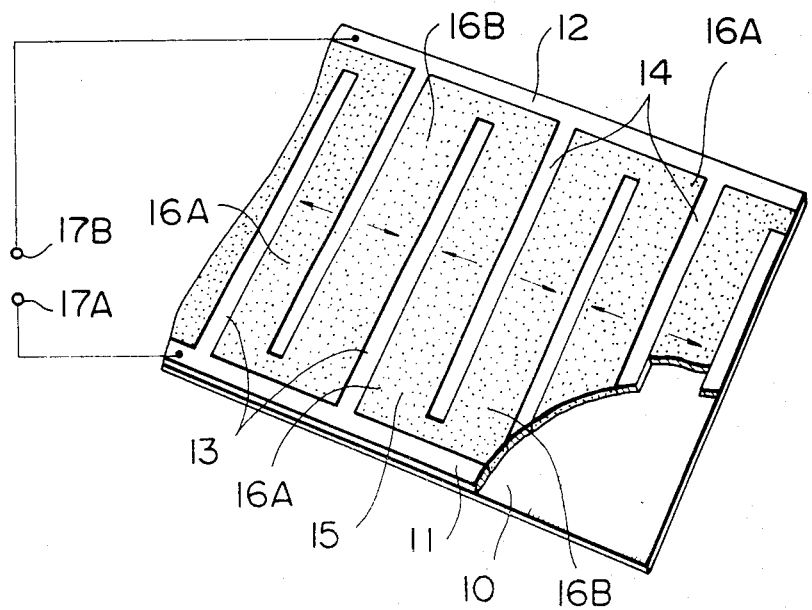
FIG. 3 is a partially fragmental perspective view showing an embodiment according to the present invention.
Figure 4:
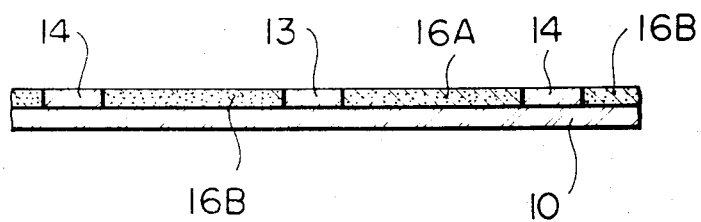
FIG. 4 is an enlarged sectional view of the arrangement of FIG. 3.

Reference is now made to FIGS. 3 and 4 of the drawings which schematically show the construction of an element according to an embodiment of the present invention.

In FIGS. 3 and 4, reference numeral 10 designates an insulating plate made of plastic, rubber, or thin ceramic material, which may be used as a supporting plate. Terminals 11 and 12 are disposed oppositely on both edge portions of the plate 10. Comb-shaped electrodes 13 and 14 are formed to be projected from the respective terminals 11 and 12. Between the adjacent electrodes 13 and 14 there is provided an isolating slit 15 into which composite piezoelectric material is filled. The terminal 11 and the electrodes 13, and the terminal 12 and the electrodes 14 may be detachably bonded to the insulating plate 1, and may be formed, for example, by etching a thin printed metal plate, bonding an etched metal strip, or screen printing of an electrically conductive rubber or resin. The thickness of the terminals 11 and 12, and the electrodes 13 and 14 is preferably about 50 to 200 microns.

The composite piezoelectric material to be filled into the respective slits 15 may be made of a mixture of piezoelectric ceramic powder and molding agent such as resin, rubber, glass or the like, and may be fixed by thermal pressing or vulcanizing to form a plurality of piezoelectric layer portions 16A and 16B which have substantially the same thickness as the electroes 13 and 14 and the terminals 11 and 12 for equalizing the polarizations in the thickness direction of the piezoelectric layer portions.

One of the terminals 11 is connected to a connecting terminal 17A and the other terminal 12 is connected to a connecting terminal 17B. These connecting terminals 17A and 17B are connected to a suitable voltage source which is not shown in the drawings. DC voltage is applied to the connecting terminals 17A and 17B so that the adjacent piezoelectric layer portions 16A and 16B are polarized reversely to each other.

In this way, sheet-like piezoelectric element is formed on the insulating plate 1.

The element thus polarized may be removed from the insulating plate 1, and may be mounted on one or both sides of a suitable vibrating plate, not shown, to form a bimorph structure. As the case may be, the insulating plate 1 may be used as the vibrating plate for the bimorph structure.

Figure 5:
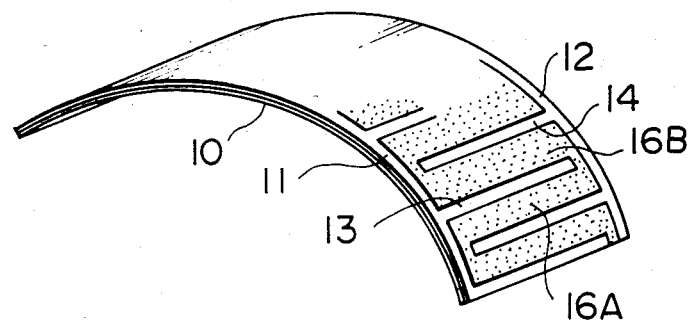
FIGS. 5 and 6 are respectively perspective views showing the elongation and contraction of the electro-mechanical transducer of the invention when a voltage is applied thereto.

When positive and negative voltages are applied to the terminals 11 and 12 through the connecting terminals 17A and 17B, respectively, all of the piezoelectric layer portions 16A and 16B are elongated in the lengthwise direction, but as shown in FIG. 5 a downward warpage occurs by the resistance of the insulating plate 1.

Figure 6:
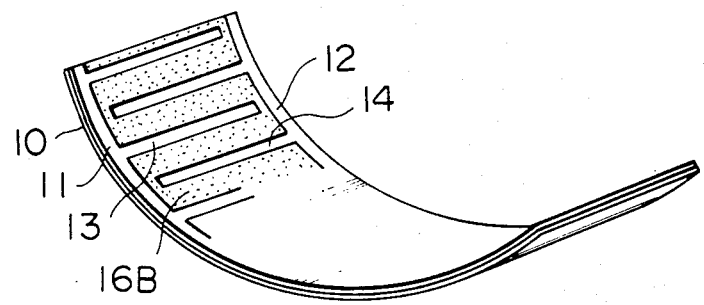

When a positive and negative voltages are, on the contrary, applied to the terminals 12 and 11, respectively, all of the piezoelectric layer portions 16A and 16B are contracted, but as shown in FIG. 6 an upward warpage occurs by the resistance of the plate 1.

Figure 7:
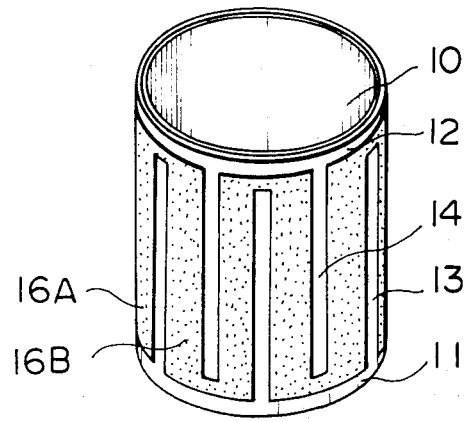
FIG. 7 is a perspective view showing an example that the piezoelectric element is formed in a cylindrical shape.

Since the piezoelectric element of the invention is provided with the layer (16A and 16B) of a composite piezoelectric material having excellent moldability and workability, the element can be easily shaped in an arbitrary form such as a cylindrical form as shown in FIG. 7 or a bent form, and in this case the increased vibrating amplitude can be obtained as compared with the case of planar form.

According to the present invention as described above, a plurality of slits are formed between the comb-shaped electrodes alternately projected in a zigzag shape from a pair of terminals oppositely arranged, the composite piezoelectric material is filled into the respective slits, a DC voltage is applied between the terminals to polarize the adjacent piezoelectric layers in reverse directions to each other, and the electrodes have a thickness corresponding to that of the piezoelectric layer. Therefore, as compared with the conventional one that the polarized electrodes are bonded to the surface of the piezoelectric ceramic substrate the DC voltage is applied uniformly to the entire thickness of the piezoelectric layer to be polarized, and the electro-mechanical conversion rate can be increased.

Since the composite piezoelectric material which can be easily molded and worked is used to form the piezoelectric layer, an extremely thin sheet-like piezoelectric element can be obtained and also an arbitrary shape element can be easily produced.

The sheet-like piezoelectric element constructed according to the present invention can be used for an electro-mechanical transducer such as a vibration film of speaker, headphone, microphone or hydrophone. Further, the element also exhibits a pyroelectric effect simultaneously with the piezoelectric effect, and thus can be used as a thermal-electric transducer such as an infrared ray detecting element.

What is claimed is:

1. A sheet-like piezoelectric element comprising a pair of oppositely arranged terminals, comb-shaped electrodes projecting alternately from respective terminals of said pair of terminals and arranged in a zigzag shape formed with a slit in the lengthwise direction between the adjacent electrodes, and a piezoelectric layer made of composite piezoelectric material filling the slits in such a manner that the adjacent piezoelectric layer portions are polarized in opposite directions to each other, said piezoelectric layer having a thickness which is substantially the same of that of said electrodes.

2. A sheet-like piezoelectric element as claimed in claim 1 wherein the piezoelectric layer comprises a mixture of piezoelectric ceramic powder and molding agent such as resin, rubber or glass.

3. A sheet-like piezoelectric element as claimed in claim 1 wherein the element is provided on an insulating plate.

4. A sheet-like piezoelectric element, as claimed in claim 3, wherein said insulating plate is arranged to form a vibrating plate for a bimorph structure.

5. An electro-mechanical transducer wherein a sheet-like piezoelectric element as claimed in claim 1 is provided on one or both sides of a suitable vibrating member to form a bimorph structure.

6. An electro-mechanical transducer as claimed in claim 5, wherein said vibrating member is an insulating means for supporting the piezoelectric element.

7. A thermal-electric transducer including a sheet-like piezoelectric element as claimed in claim 1.

* * * * *